United States Patent [19]

Zai et al.

[11] Patent Number: 5,541,520
[45] Date of Patent: Jul. 30, 1996

[54] FILTERING FOR ELECTRONIC MODULE TEST

[75] Inventors: Li-Cheng R. Zai, Ossining, N.Y.; Shaul Halevi, Petach Tickva, Israel

[73] Assignee: International Business Machines Corporation, Armonk, N.Y.

[21] Appl. No.: 333,084

[22] Filed: Oct. 31, 1994

[51] Int. Cl.$^6$ .................................................. G01R 19/12
[52] U.S. Cl. ........................... 324/618; 324/605; 364/579
[58] Field of Search .......................... 341/123; 73/49.2 R; 324/618, 617, 605, 606, 607; 364/578, 579, 572

[56] References Cited

U.S. PATENT DOCUMENTS

| | | | |
|---|---|---|---|
| 3,372,765 | 3/1968 | Hatton | 324/618 |
| 4,172,477 | 10/1979 | Reich | 73/49.2 R |
| 4,810,950 | 3/1989 | Young | 324/618 |
| 4,896,530 | 1/1990 | Lehmann | 73/49.2 R |
| 5,162,744 | 11/1992 | Koozer | 324/618 |

*Primary Examiner*—Kenneth A. Wieder
*Assistant Examiner*—Jose M. Solis
*Attorney, Agent, or Firm*—David Aker

[57] ABSTRACT

A method and apparatus for determining when transient responses of a signal have ended. A plurality of filters is provided. Operation of success of filters is cause to begin at successive times. The convergence of the outputs of the various filters is then tested. When convergence is detected, the signal provided by the first started filter of the successive filters that indicated convergence is used as an output signal. The signal is typically an electronic module test signal from an electronic module. Testing for convergence is performed by averaging outputs of each filter started to determine an average value; determining a deviation of each output of the filters from the average value; totaling the deviation to determine a total deviation; and comparing the total deviation to a reference level. Preferably, the total deviation is integrated over a period of time to provide an integrated total deviation; and the integrated total derivation is compared to the reference level.

20 Claims, 4 Drawing Sheets

(12) United States Patent

FILTERING FOR ELECTRONIC MODULE TEST

TECHNICAL FIELD

This invention relates to electronic filtering. More particularly, it relates to a method and apparatus for determining when a transient response has died out and a useful signal is present. More specifically, it relates to a method and an apparatus useful in the testing of electronic modules.

BACKGROUND ART

The Electronic Module Test (EMT) has been widely used to detect latent defects in high density multilayer substrates and circuit boards. Versions of EMT testers are disclosed in U.S. Pat. Nos. 4,496,900 and 4,868,506 assigned to the assignee of the present invention.

FIG. 1 illustrates a typical test set up for an EMT tester 10. A test instrument 12 is connected to a substrate 14, placed in a substrate holder 16, by a pair of conductors 18 and 19. The conductors are connected to electrically conductive test probes 20 and 22, which may be physically moved into contact with the substrate 14 to contact conductors thereon.

These probes are positioned at high speed by positioning devices such as those disclosed in U.S. Pat. Nos. 5,180,955, 5,291,112 and 5,153,472. Such positioning mechanisms rapidly move the probes into place, after which a test is conducted by test instrument 12. The positioning devices then rapidly move the probes 20 and 22 to a next set of positions to conduct a test on different conductors of electronic module 14.

Test instrument 12 includes system control unit 24, which may be microprocessor, or a suitably programmed personal computer. System control unit 24 controls a test signal generator 26 which provides a signal to probes 20 and 22 by way of conductors 18 and 19. Also connected to conductors 18 and 19 is a measurement circuit 28 including appropriate preamplifiers for acquiring signals from substrate 14 during a test. After suitable amplification, these signals are sent to a signal processing unit 30 which also operates under the control of system control unit 24. An output is eventually provided by signal processing unit 30 indicating whether a test has been passed or failed.

Testers of the type described above must detect a small fixed-frequency signal generated by defects in the substrate 14. Since the signal is of low amplitude, it must not only be amplified, but it must be filtered to remove noise and transients. Generally, conventional analog filters were used. However, there are two major problems using such conventional analog filters. One is the slow rise time of the filter. The other is that the transient signal due to probe bounce is generally large in amplitude and blocks the signal. It is necessary to wait a significant amount of time before the transient dies out and the filtered signal is suitable as the basis for making a determination as to whether the device under test has a defect.

One way to block the transient signal into the analog filter is to wait a fixed period of time, which is usually estimated by using the worst case of probe bounce experienced after the test probes have been placed on the substrate 14 being tested. This approach adds an undue wait time for every measurement of the many thousands of measurements that may be conducted on the substrate 14. This delay unduly reduces the possible through-put for the tester 10.

SUMMARY OF THE INVENTION

It is an object of the invention to provide a filtering method and apparatus for determining when transient response of a signal has died out and a useful portion of the signal is present.

It is another object of the present invention to provide an apparatus and method for filtering electronic signals which is useful in electronic module testing.

It is another object of the invention to provide a method and apparatus for determining when a signal has converged to a steady state value.

The invention provides a method and apparatus for determining when transient responses of a signal have ended. In accordance with the invention, a plurality of filters is provided. Operation of successive filters is caused to begin at successive times. The convergence of the outputs of the various filters is then tested. When convergence is detected, the signal provided by the first started filter of the successive filters that indicated convergence is used as an output signal. The signal is typically an electronic module test signal from an electronic module. Testing for convergence is performed by averaging outputs of the successive filters started to determine an average value; determining a deviation of each output of the filters from the average value; totaling the deviation to determine a total deviation; and comparing the total deviation to a reference level. Preferably, the total deviation is integrated over a period of time to provide an integrated total deviation; and the integrated total derivation is compared to the reference level.

DETAILED DESCRIPTION OF THE PREFERRED EMBODIMENTS

Figure 2:
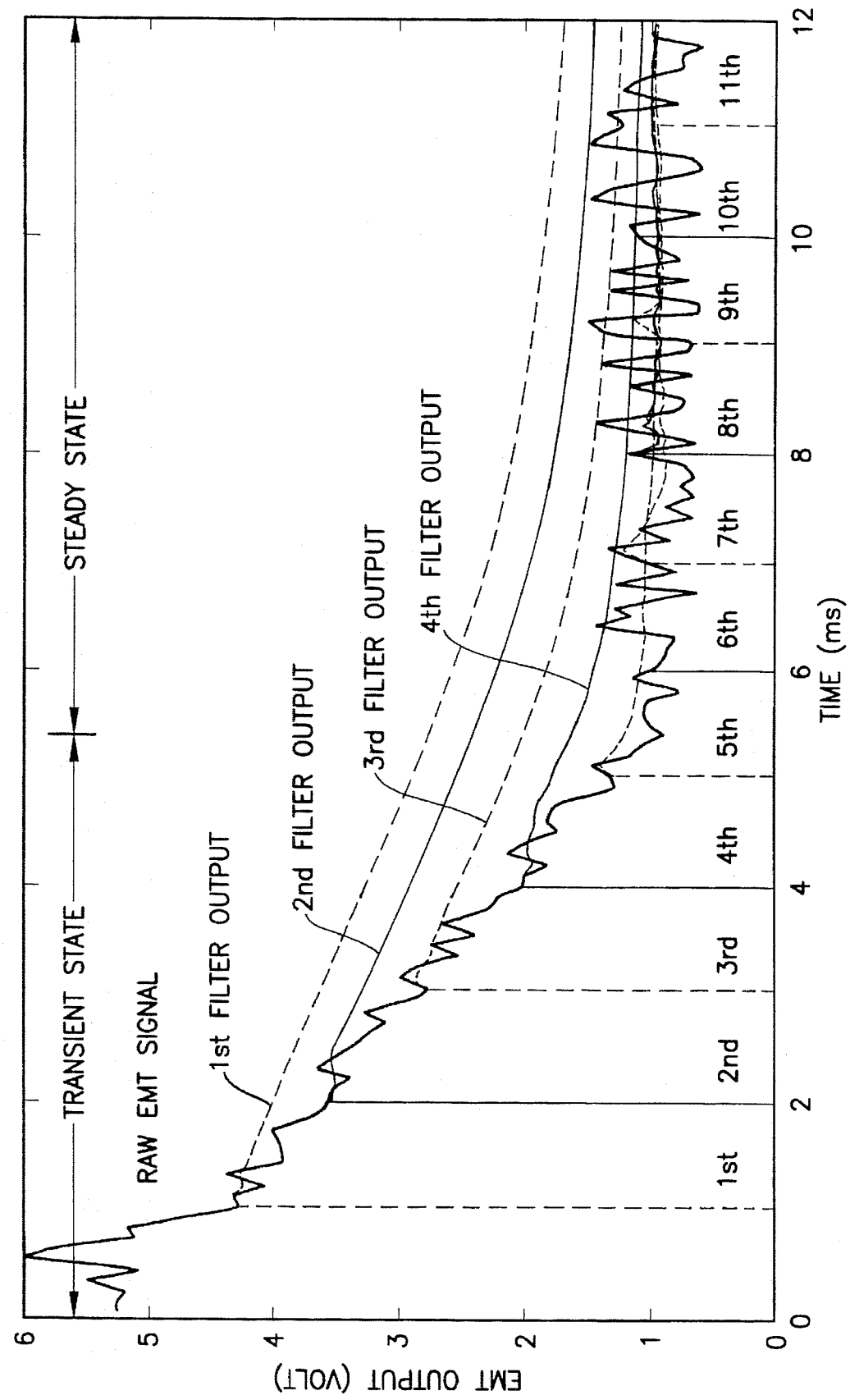
FIG. 2 is a graphical illustration of a typical signal derived from the apparatus of FIG. 1, including the outputs of successively started filters, in accordance with the invention.

A typical EMT measurement signal is illustrated in FIG. 2. There is a transient state followed by a steady state. In order to maximize tester through-put, the critical issue is, at what point can the single processing unit 30 begin making use of the signal when the length of the transient state may vary significantly from test to test.

Figure 3:
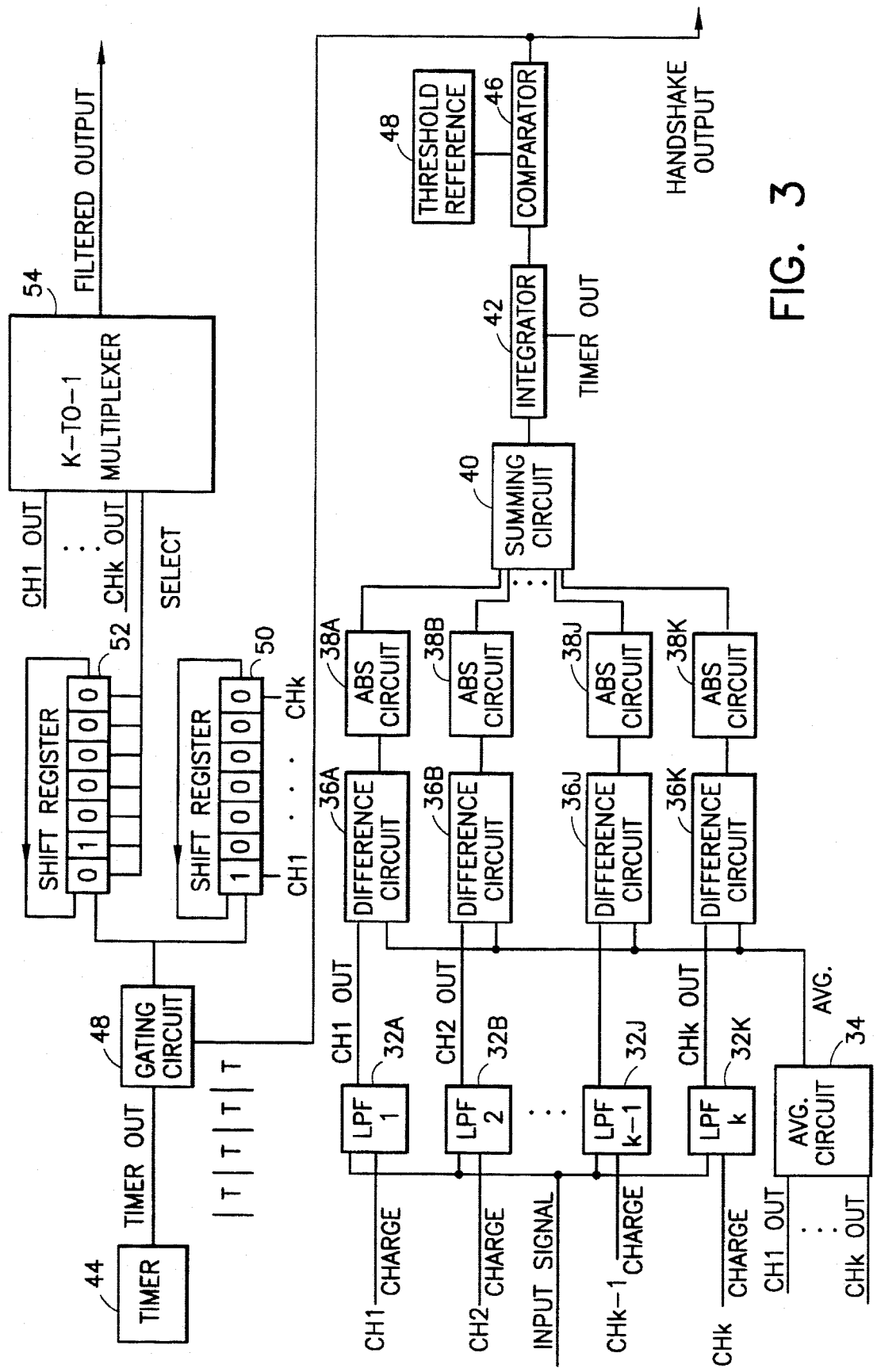
FIG. 3 is a block diagram of an analog circuit implementation of the invention used in the signal processing unit of FIG. 1.

FIG. 3 illustrates an analog implementation of the invention. An input signal such as that illustrated in FIG. 2 is supplied to a series of low-pass filters 32A, 32B . . . 32K. Each low-pass filter has provisions for a rapid charge transfer to charge the filter output to its input level instantaneously when the "charge" input is set. Thereafter, it acts as a conventional low-pass filter. The rapid charging on subsequent filtering of successively started filters is illustrated in FIG. 2.

The output of each low-pass filter is provided to an averaging circuit 34 which provides at its output a value equal to the average of the instantaneous inputs from the various filters. The average output is provided to the inverting input of each of a series of difference circuits 36A, 36B ... 36K. The non-inverting input of each one of difference circuits 36A to 36K is connected to the output of a respective low-pass filter 32A to 32K. Thus, the outputs of difference circuits 36A to 36K provide a signal indicative of the difference between the instantaneous output of each one of the low-pass filters 32A to 32K and the average of those outputs.

The outputs of difference circuits 36A to 36K are provided to respective absolute value determining circuits 38A to 38K. The absolute value outputs or circuits 38A to 38K are all in turn provided to a summing circuit 40 which provides an output equal to the sum of the inputs from absolute value circuits 38A to 3K. The output of summing circuit 40 is provided to an integrator circuit 42 which integrates over a time period determined by successive pulses from a timer 44. The output of integrator circuit 42 is provided to one input of a comparator 46 where it is compared to a reference voltage generated by a reference generator 48 which may be set to a fixed voltage. The reference voltage is determined by the accuracy requirement of the filtered measurement output. The integrator 42 is successively reset and then integrates over time intervals between pulses of timer 44. When the output of the integrator 42 is greater than the threshold determined by threshold generator 48, comparator 46 provides an output which causes a gating circuit 48 to be closed and successive pulses from timer 44 clock a first shift register 50 and a second shift register 52. The shift registers are preloaded so that shift register 52 has a data "1" value at a position one stage ahead of shift register 50. The outputs of shift register 50 are provided to successively charge the low-pass filters 32A to 32K to the input signal level at successive clock pulse outputs from timer 44.

The output of comparator 46 also acts as a "handshaking" signal to instrument 12 to indicate that transients have fallen below an acceptable level and signal processing may proceed.

Figure 1:
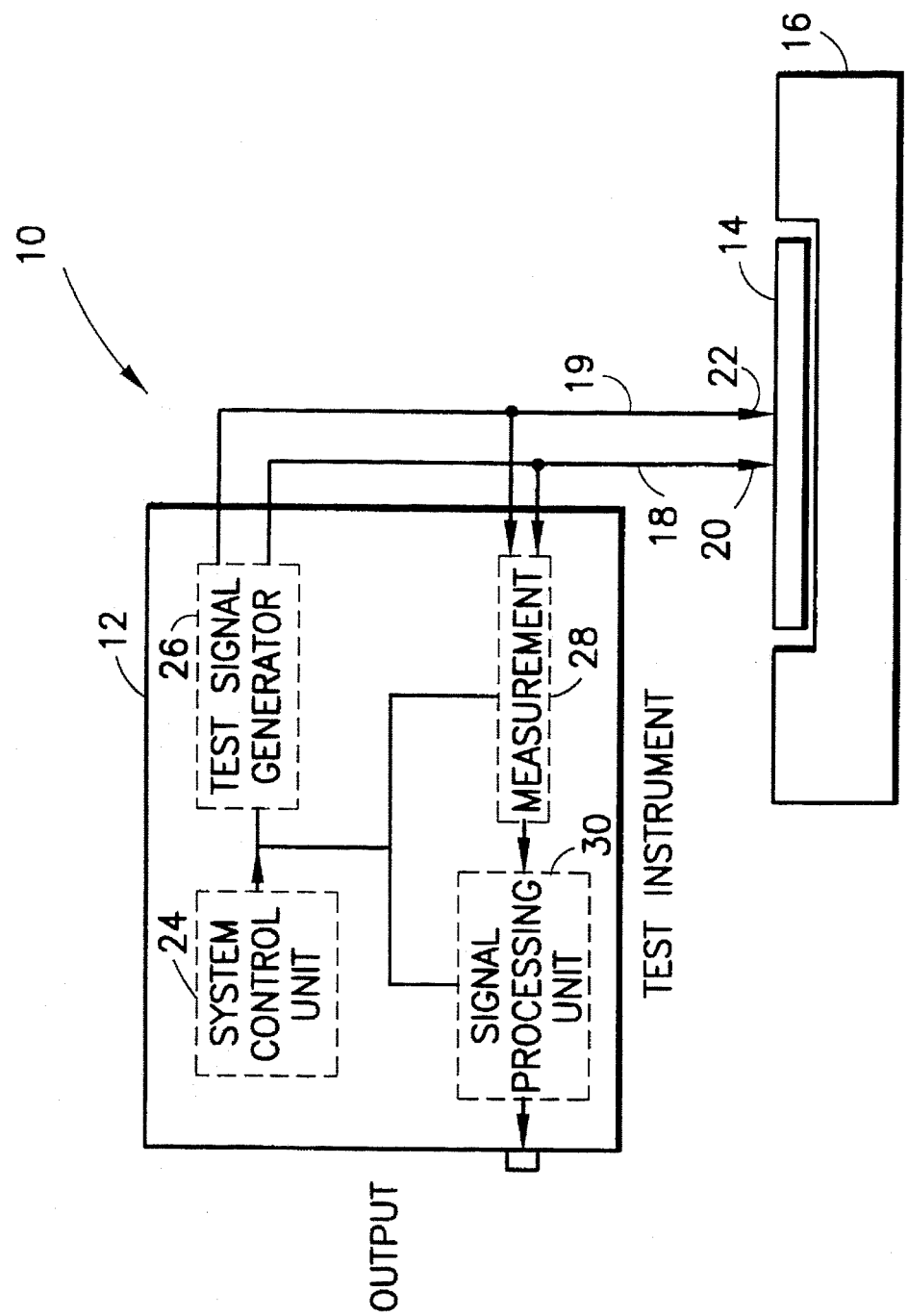
FIG. 1 is a block diagram of a tester which may include a filter in accordance with the invention.

The outputs of shift register 52 are provided to the selector inputs of a K-to-1 multiplexer 54. The outputs of low-pass filters 32A to 32K are provided to the analog inputs of the multiplexer 54. When comparator 46 indicates that convergence has occurred on the basis of the output of integrator circuit 42 falling below the reference voltage provided by reference generator 48, the gating circuit 48 is opened, and hence pulses are no longer provided to advance the shift registers 50 and 52. At this time a channel output, as selected by the output of shift register 52 which is at a logic "1" level, is strobed to the output of multiplexer 54. This signal is used as the filtered output which is then processed by signal processing unit 30 (FIG. 1). This output is available for immediate processing as soon as the transient portion of the test signal is no longer of significant amplitude. It is not necessary to wait a fixed delay interval to take into account the worst case bounce situation. To the extent that the transient response is shorter than the worst case, testing may begin earlier. After the test has been conducted, the circuits are all initialized (by system control unit 24 of FIG. 1), including resetting integrator circuit 42 and setting the appropriate preload data into shift registers 50 and 52, displaced by one stage. Probes 20 and 22 are moved and the circuit is used again for conducting the next test.

Figure 4:
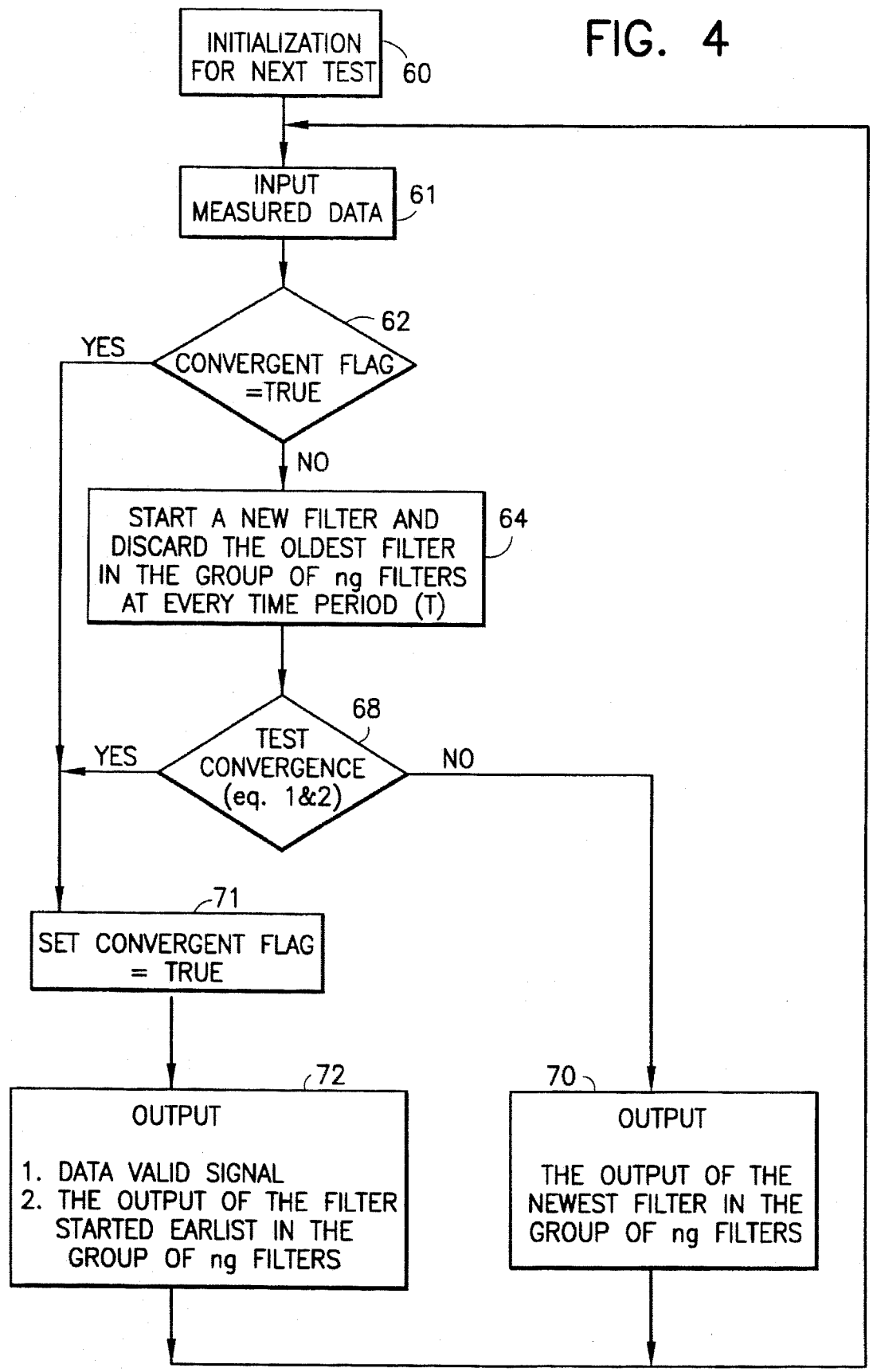
FIG. 4 is a flow chart of a digital implementation of the invention used in the signal processing block of FIG. 1.

FIG. 4 illustrates the manner in which the present invention may be implemented digitally. A program can be written in, for example, the "C" language to perform the steps illustrated in FIG. 4. At step 60, the system is initialized in preparation for conducting the next test. At step 61, measured data, that is, a signal such as that illustrated in FIG. 2 is provided as an input. At step 62, a convergence flag is checked to see if convergence has occurred. Assuming that convergence has not occurred, at step 64, the newest filter is started and the oldest filter is closed of a group of $n_p$ filters. Many digital filter algorithms can be used for implementing the low-pass filter function. For example, the low-pass filters can be any of the infinite impulse response (IIR) or finite impulse response (FIR) filters with calculated initial conditions to reduce rise time, such as those described in Ifeachor, E. C. and Jervice, B. W., "Digital Signal Processing", Addison-Wesley, 1993.

At step 68, a test for convergence is performed using equation 1 and 2.

$$\sum_{i=p+1-n_g}^{p} \sum_{k=q+1-n_t}^{q} |y_i(k) - y_{avg}(k)| < \epsilon \quad (1)$$

where $$y_{avg}(k) = \frac{1}{n_g} \sum_{i=p+1-n_g}^{p} y_i(k) \quad (2)$$

where $Y_i(k)$ is the output of the ith low-pass filter at sampling time k, the pth filter is the most recent filter, q is the most recent sampling time, $n_g$ is the number of filters in the group and $\epsilon$ is the threshold reference. The convergence may be tested in a period of $n_t$ sampling clocks to prevent false convergence detection in which the filter outputs converge at one sampling time and later diverge.

If no convergence has occurred, the program branches to step 70 where the output of the most recent filter is utilized as the program branches back to step 61. No convergence has taken place.

If at step 68, convergence has taken place, the branching to step 71 occurs where a convergence flag is set. The program continues to step 72 where a data valid signal is provided. (This is similar to the change in the output of comparator 46 of FIG. 3.) The output of the filter started earliest in the group of filters is used as valid data output to be processed by signal processing unit 30 (FIG. 1).

Thus, in accordance with the invention, once the outputs of a group of most recent filters, which were started at consecutive times converge, the end of the transient is detected and the output of the filter started earliest in the group is used for measurement.

The present invention is superior to conventional methods for transient detection which use high-pass filters or detect the peaks and valleys of the signal. These conventional methods are not effective in electronic module test measurements because slowly decaying transients can escape transient detection while large high-frequency components in the steady state can falsely trigger the transient detector. Both cases result in erroneous measurement.

Thus, the present invention provides a robust detection of the end of the transient, a variable measurement time allowing signal processing to begin at the earliest possible moment, effective use of the sample data and relatively simple implementation, especially in the digital case illustrated in FIG. 4.

We claim:

1. An apparatus for determining when transient responses of a signal have ended, said apparatus comprising:

a plurality of filters;

starting means for starting operation of successive ones of said filters at successive times;

testing means for testing convergence of the outputs of said filters;

indicating means for indicating an end to transient response when said testing means indicates convergence.

2. The apparatus of claim 1 wherein said testing means comprises:

means for averaging outputs of said filters to provide an average output;

difference means, for each filter, for determining a difference between an output of the filter and said average output, and means for totaling deviation of the outputs of all of said difference means from said average output to provide a totaled output, wherein said indicating means includes comparing means for comparing said totaled output to a reference level to determine whether convergence has occurred.

3. The apparatus of claim 2, further comprising integrating means for integrating said totaled output to provide an integrated output, said integrated output being compared to said reference level by said comparing means.

4. The apparatus of claim 2 wherein said totaling means comprises:

an absolute value circuit for each difference means for determining an absolute value of a respective difference; and a summer for summing absolute values obtained by said absolute value circuit.

5. The apparatus of claim 1 wherein said starting means comprises:

a timer for providing a series of clock pulses;

a gate fin gating said pulses;

a shift register for shifting data in response to said pulses, so that data is shifted to successive outputs of said shift register, said outputs being used to initiate fast charge of said filters.

6. The apparatus of claim 5 wherein said testing means comprises:

means for averaging outputs of said filters to provide an average output;

difference means, for each filter, for determining a difference between an output of the filter and said average output, and means for totaling deviation or the outputs of all of said difference means from said average output to provide a totaled output, and wherein said indicating means includes comparing means for comparing said totaled output to a reference level to determine whether convergence has occurred.

7. The apparatus of claim 6 wherein said comparing means provides an output to control said gate means.

8. The apparatus of claim 7 further comprising:

a second shift register, said second shift register being clocked by said clock pulses, said second shift register being preloaded with data to place it one clock pulse ahead of said first shift register; and a multiplexer for receiving as signal inputs, outputs of said filters and providing a multiplexer output, said multiplexer having a number of selector inputs, said selector inputs receiving outputs of said second shift register so as to select which of said inputs is provided as an output.

9. A method for determining when transient responses of a signal have ended comprising the steps of:

providing a plurality of filters;

starting operation of successive ones of said filters at successive times; and testing convergence of outputs of the filters.

10. The method of claim 9 further comprising:

selecting a signal provided by a first filter of said successive filters that tests positively for convergence.

11. The method of claim 9 further comprising:

providing an indication of convergence when testing for convergence indicates that convergence has occurred.

12. The method of claim 9 wherein said signal is an EMT signal from an electronic module, and an evaluation of the module is performed using an oldest output of a group of outputs that test positive for convergence.

13. The method of claim 9 wherein testing for convergence is performed by:

averaging outputs of each filter started to determine an average value;

determining a deviation of each output of the filters from the average value;

totaling the deviation to determine a total deviation;

comparing the total deviation to a reference level.

14. The method of claim 13 further comprising:

integrating the total deviation over a period of time to provide an integrated total deviation; and comparing the integrated total derivation to the reference level.

15. A test instrument for an electronic module, comprising:

connection means for electrically connecting the instrument to a module under test;

means for supplying a test signal to said module via said connection means;

means for acquiring a return signal from said electronic module via said connection means; and an apparatus for determining when transient responses of said return signal have ended, said apparatus comprising:

a plurality of filters;

starting means for starting operation of successive ones of said filters at successive times;

testing means for testing convergence of the outputs of said filters; and indicating means for indicating an end to transient response when said testing means indicate convergence.

16. The apparatus of claim 15 wherein said testing means comprises:

means for averaging outputs of said filters to provide an average output;

difference means, for each filter, for determining a difference between an output of the filter and said average output, and means for totaling deviation of the outputs of all of said difference means from said average output to provide a totaled output, wherein said indicating means includes comparing means for comparing said totaled output to a reference level to determine whether convergence has occurred.

17. The apparatus of claim 16, further comprising integrating means for integrating said totaled output to provide an integrated output, said integrated output being compared to said reference level by said comparing means.

18. The apparatus of claim 16 wherein said starting means comprises:

a timer for providing a series of clock pulses;

a gate for gating said pulses;

a shift register for shifting data in response to said pulses, so that data is shifted to successive outputs of said shift register, said outputs being used to initiate fast charge of said filters.

19. The apparatus of claim 1 wherein said starting means comprises:
 a timer for providing a series of clock pulses;
 a gate for gating said pulses;
 a shift register for shifting data in response to said pulses, so that data is shifted to successive outputs of said shift register, said outputs being used to initiate fast charge of said filters.

20. The test instrument of claim 15 further comprising:
 a holder for holding an electronic module;
 wherein said connection means comprises a pair of electrical conductors, and an electrical probe at an end of each conductor for probing said module.

\* \* \* \* \*